(12) United States Patent
Li (10) Patent No.: US 10,790,206 B2
(45) Date of Patent: Sep. 29, 2020

(54) TESTING STRUCTURE, AND FABRICATION AND TESTING METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 203 days.

(21) Appl. No.: 15/856,388

(22) Filed: Dec. 28, 2017

(65) Prior Publication Data

US 2018/0190551 A1 Jul. 5, 2018

(30) Foreign Application Priority Data

Dec. 30, 2016 (CN) .......................... 2016 1 1262695

(51) Int. Cl.
*G01R 31/28* (2006.01)
*H01L 21/66* (2006.01)
(Continued)

(52) U.S. Cl.
CPC .......... *H01L 22/34* (2013.01); *G01R 31/2886* (2013.01); *H01L 21/76895* (2013.01);
(Continued)

(58) Field of Classification Search
CPC .............. H01L 22/34; H01L 21/76895; G01R 31/2886
See application file for complete search history.

(56) References Cited

U.S. PATENT DOCUMENTS 6,066,561 A * 5/2000 Kumar .................... H01L 22/12
257/E21.53
6,686,250 B1 * 2/2004 Kalnitsky ......... H01L 29/66242
257/E21.371
(Continued)

FOREIGN PATENT DOCUMENTS

CN 206258520 U 6/2017

OTHER PUBLICATIONS

J. G. J. Chern, Determining Specific Contact Resistivity from Contact End Resistance Measurements (Year: 1984).*
(Continued)

*Primary Examiner* — Alvaro E Fortich
(74) *Attorney, Agent, or Firm* — Anova Law Group, PLLC (57) ABSTRACT

Testing structures, and their fabrication methods and testing methods are provided. An exemplary testing structure includes a base substrate containing a well region; a first doped epitaxial region in the well region and having a doping type same as a doping type of the well region; a dielectric layer on the base substrate and covering the well region and the first doped epitaxial region; a first contact plug passing through the dielectric layer and electrically connected with the first well region; and a second contact plug and a third contact plug. The second contact plug and the third contact plug pass through the dielectric layer and electrically connected with the first doped epitaxial region. The second contact plug is independent from the third contact plug and between the first contact plug and the third contact plug.

3 Claims, 4 Drawing Sheets

(51) Int. Cl.
*H01L 21/768* (2006.01)
*H01L 21/8234* (2006.01)
*H01L 23/535* (2006.01)
*H01L 27/088* (2006.01)
*H01L 29/66* (2006.01)

(52) U.S. Cl.
CPC .... *H01L 21/823431* (2013.01); *H01L 23/535* (2013.01); *H01L 27/0886* (2013.01); *H01L 29/665* (2013.01)

(56) References Cited

U.S. PATENT DOCUMENTS

| | | | | |
|---|---|---|---|---|
| 8,564,061 | B2* | 10/2013 | Rieger | H01L 21/76838 257/343 |
| 9,470,745 | B2* | 10/2016 | Kim | G01R 31/2644 |
| 2004/0031960 | A1* | 2/2004 | Wu | G11C 8/14 257/48 |
| 2008/0227250 | A1* | 9/2008 | Ranade | H01L 21/76897 438/203 |
| 2008/0248380 | A1* | 10/2008 | Blanchard | G11C 13/0007 429/126 |
| 2008/0277732 | A1* | 11/2008 | Shima | H01L 21/823807 257/368 |
| 2009/0170268 | A1* | 7/2009 | Teo | H01L 21/26586 438/285 |
| 2010/0133690 | A1* | 6/2010 | Motojima | H01L 23/53238 257/751 |
| 2012/0242356 | A1* | 9/2012 | Ohuchi | H01L 22/34 324/705 |
| 2016/0211338 | A1* | 7/2016 | Wang | H01L 21/823481 |

OTHER PUBLICATIONS

The European Patent Office (EPO) The Extended European Search Report for 17208749.6 dated May 17, 2018 14 Pages.

Adusumilli P et al: "Ti and NiPt/Ti liner silicide contacts for advanced technologies", 2016 IEEE Symposium on VLSI Technology, IEEE, Jun. 14, 2016 (Jun. 14, 2016), pp. 1-2, XP032969366, DOI: 10.1109/VLSIT.2016.7573382.

J.G.J. Chern et al: "Determining specific contact resistivity from contact end resistance measurements", IEEE Electron Device Letters., vol. 5, No. 5, May 1984 (May 1984), pp. 178-180, XP055472495, US ISSN: 0741-3106, DOI: 10.1109/EDL.1984.25875.

* cited by examiner

TESTING STRUCTURE, AND FABRICATION AND TESTING METHODS THEREOF

CROSS-REFERENCES TO RELATED APPLICATIONS

This application claims the priority of Chinese patent application No. 201611262695.6, filed on Dec. 30, 2016, the entirety of which is incorporated herein by reference.

FIELD OF THE DISCLOSURE

The present disclosure generally relates to the field of semiconductor technologies and, more particularly, relates to testing structures and their fabrication and testing methods.

BACKGROUND

With continuous increase of integration level of devices formed during semiconductor manufacturing processes (e.g., MOS/CMOS processes), the miniaturization of the devices are having some challenges. Among of such challenges, with the continuous shrinking of the semiconductor devices, the parasitic external resistance ($R_{ext}$) has become one of the major reasons limiting the performance of the semiconductor devices. The parasitic external resistance includes the contact resistance ($R_c$) between the metal silicide layer and the doped source/drain regions.

A chain mode testing structure or a Kelvin testing structure is often used to measure the contact resistance. For the chain mode testing structure, two contact plugs are connected to two ends of the metal silicide layer, respectively; and metal lines are used to connect one unit to a next unit; and all the units are connected together by a chain mode in serial. By applying a voltage on the two ends of the chain (the plurality of units) and measuring the corresponding current, the resistance of the entire structure (the chain) is obtained. The resistance is divided by the number of the contact plugs, one half of the resistance between one contact plug and the metal silicide layer is obtained. Thus, the resistance between the contact plug and the metal silicide layer is obtained. However, the chain mode testing structure is only able to obtain the contact resistance between the contact plug and the metal silicide layer, it is unable to obtain the contact resistance between the metal silicide layer and the doped source/drain regions. The contact resistance between the metal silicide layer and the doped source/drain regions is also an important parameter of the semiconductor device.

With the application of the embedded stress technology, the accuracies of the contact resistances obtained by the testing structures provided by the semiconductor structures are relatively low. Thus, there is a need to provide new testing structures and testing methods to improve the accuracy of the measured contact resistances. The disclosed testing structures and methods are directed to solve one or more problems set forth above and other problems in the art.

BRIEF SUMMARY OF THE DISCLOSURE

One aspect of the present disclosure includes a testing structure. The testing structure includes a base substrate, containing a well region; a first doped epitaxial region in the well region and having a doping type same as a doping type of the well region; a dielectric layer on the base substrate, and covering the well region and the first doped epitaxial region; a first contact plug passing through the dielectric layer and electrically connected with the first well region; and a second contact plug and a third contact plug, each passing through the dielectric layer and electrically connected with the first doped epitaxial region, wherein the second contact plug is independent from the third contact plug and between the first contact plug and the third contact plug.

Another aspect of the present disclosure includes a method for fabricating a testing structure. The method includes providing a base substrate containing a well region; forming a first doped epitaxial region in the well region having a doping type same as a doping type of the well region; forming a dielectric layer over the base substrate, and covering the well region and the first doped epitaxial region; forming a first contact plug passing through the dielectric layer and electrically connected with the well region at one side of the first doped epitaxial region; and forming a second contact plug and a third contact plug, each passing through the dielectric layer and electrically connected with the first doped epitaxial region, wherein the second contact plug is independent from the third contact plug and between the first contact plug and the third contact plug.

Another aspect of the present disclosure includes a testing method. The testing method includes providing a testing structure having a base substrate containing a well region, a first doped epitaxial region in the well region and having a doping type same as a doping type of the well region, a dielectric layer on the base substrate and covering the well region and the first doped epitaxial region, a first contact plug passing through the dielectric layer and electrically connected with the first well region; and a second contact plug and a third contact plug, each passing through the dielectric layer and electrically connected with the first doped epitaxial region, wherein the second contact plug is independent from the third contact plug and between the first contact plug and the third contact plug; applying a first external current on a first end portion of the second contact plug; applying a second external current smaller than the first external current on the first contact plug to form a current loop among the first contact plug, the first doped epitaxial region under the second contact plug and the first contact plug; measuring a top potential of the second contact plug through a second end portion of the second contact plug; measuring a bottom potential of the first doped epitaxial region through the third contact plug; and obtaining the contact resistance between the metal silicide layer and the first doped epitaxial region according to the first external current, the top potential and the bottom potential.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
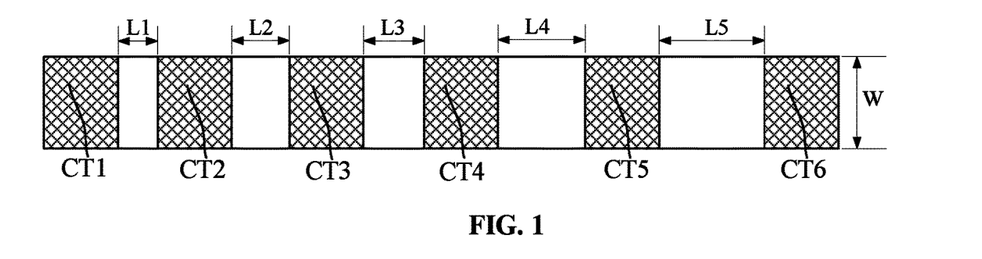
FIG. 1 illustrates a top view of a testing structure.
Figure 2:
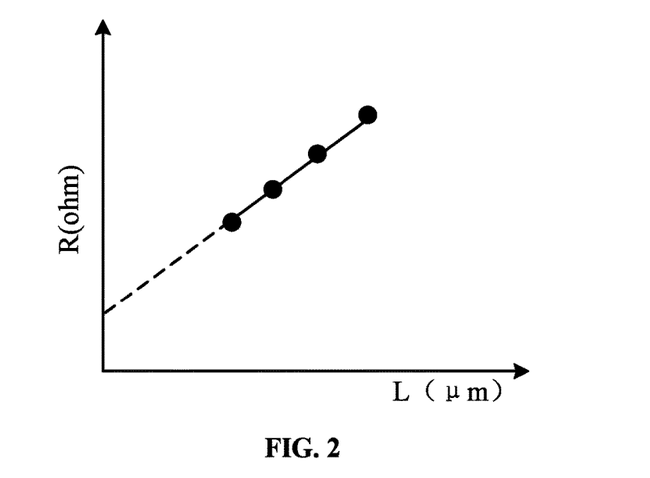
FIG. 2 illustrates a correlation between the total resistance measured by the testing structure illustrated in FIG. 1 and the distance between adjacent contact plugs.

FIG. 1 illustrates a top view of the testing structure. FIG. 2 illustrates a correlation between the total resistance measured by the testing structure illustrated in FIG. 1 and the distance between adjacent contact plugs.

Currently, a transmission line modeling (TLM) method is often used to measure the contact resistance between the metal silicide layer and the doped source/drain regions.

Specifically, the testing structure includes a base substrate (not shown); a well region (not shown) in the base substrate; a doped epitaxial region (not shown); a dielectric layer (not shown) covering the well region and the doped epitaxial region (not shown); a plurality of contact plugs passing through the dielectric layer, electrically connecting with the doped epitaxial regions and having a metal silicide layer on the doped epitaxial regions; and conductive plugs (not shown) on the metal silicide layer. The sizes of the plurality of contact plugs are identical and the materials of the plurality of contact plugs are identical. The distances between adjacent contact plugs are different. The widths "W" of the plurality of contact plugs are equal.

As shown in FIG. 1, the plurality of contact plugs includes a first contact plug CT1, a second contact plug CT2, a third contact plug CT3, a fourth contact plug CT4, a fifth contact plug CT5 and a sixth contact plug CT6. The distance between the first contact plug CT1 and the second contact plug CT2 is L1. The distance between the second contact plug CT2 and the third contact plug CT3 is L2. The distance between the third contact plug CT3 and the fourth contact plug CT4 is L3. The distance between the fourth contact plug CT4 and the fifth contact plug CT5 is L4. The distance between the fifth contact plug CT5 and the sixth contact plug CT6 is L5. L1, L2, L3, L4, and L5 are different from each other.

During the TLM testing method, the total resistance "R" between the adjacent contact plugs is obtained. According to the distance "L" between adjacent contact plugs, the correlation between the total resistance "R" and the distance "L" between adjacent contact plugs is obtained by a simulation process. Referring to FIG. 2, the abscissa refers to as the distance "L" between the adjacent contact plugs; and the ordinate refers to as the total resistance "R" between adjacent contact plugs. The equation of the correlation between the total resistance "R" and the distance "L" between adjacent conductive plugs is: $R=2\times R_c+R_{SH}\times(L/W)$. "$R_c$" is the resistance of the contact plug. "$R_{SH}$" is the sheet resistance.

The resistance "$R_c$" of the conductive plug includes the resistance of the conductive plug, the resistance of the metal silicide layer, and the contact resistance between the metal silicide layer and the doped epitaxial region. The resistance of the conductive plug and the resistance of the metal silicide layer are obtainable. Thus, according to the equation: $R=2\times R_c+R_{SH}\times(L/W)$, when the distance "L" between the adjacent conductive plugs is zero (the limit value), the total resistance "R" is two times of the resistance "Re" of the conductive plug. That is: $R=2\times R_c$. Correspondingly, the contact resistance between the metal silicide layer and the doped epitaxial region can be obtained by a calculation.

However, with the continuously shrinking of semiconductor devices, the difficulties for forming conductive plugs with a same size have increased. Further, with the changing of the distances "L" between adjacent contact plugs, the sizes of the contact plugs are also correspondingly changed. Thus, the accuracy of the contact resistance "$R_c$" obtained by the equation: $R=2\times R_c+R_{SH}\times(L/W)$ is correspondingly reduced. That is, it is difficult to obtain the contact resistance between the metal silicide layer and the doped epitaxial region.

The present disclosure provides a testing structure, a method for fabricating a testing structure, and a testing method. The testing structure includes a first doped epitaxial layer in the well region. The doping type of the well region and the doping type of the first doped epitaxial region may be substantially same. The testing structure may also include a dielectric layer; and a first contact plug, a second contact plug and a third contact plug in the dielectric layer. The first contact plug may be electrically connected with the well region. The second contact plug and the third contact plug may be electrically connected with the first doped epitaxial region. The second contact plug and the third plug may be independent from each other; and the second contact plug may be between the first contact plug and the third contact plug. The second contact plug may include a metal silicide layer on the first doped epitaxial region and a first conductive plug on the metal silicide layer. Along a direction parallel to the substrate and a length direction of the second contact plug, the surface of the second contact plug may have two end portions. One end portion of the second contact plug may be used as a terminal for applying an external current; and the other end portion of the second contact plug may be used as a terminal for measuring the top potential. The first contact plug may be used as a terminal for applying a second external current; and the third contact plug may be used as a terminal for measuring the bottom potential. The second external current may be smaller than the first external current. When the first external current and the second external current are applied, a current loop may be formed among the second contact plug, the first doped epitaxial region, the well region and the first contact plug. Thus, the top potential of the of the second contact plug may be measured from the other end portion of the second contact plug. The third contact plug may be not in the current loop. The potential measured from the third contact plug may be the bottom potential of the first doped epitaxial region. Thus, the contact resistance between the metal silicide layer and the first doped epitaxial region may be obtained according to the first external current, the top potential and the bottom potential. Comparing with the approach based the transmission line model (TLM), the disclosed method may be able to avoid the errors caused by the size differences between different contact plugs. Thus, the contact resistance obtained by the disclosed method may have relatively high accuracy and reliability.

Figure 3:
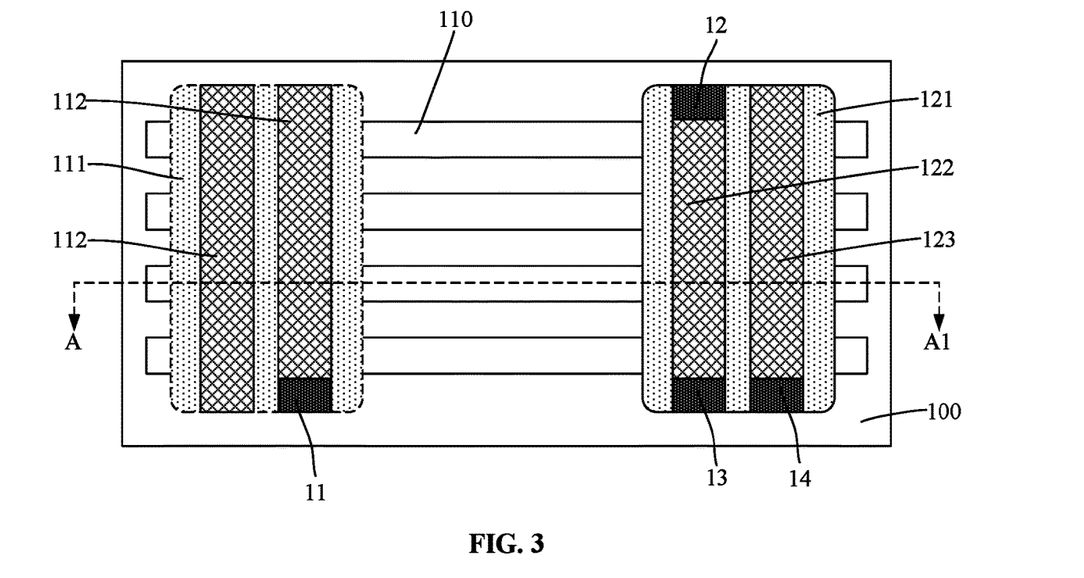
FIGS. 3-4 illustrate an exemplary testing structure consistent with various disclosed embodiments.
Figure 4:
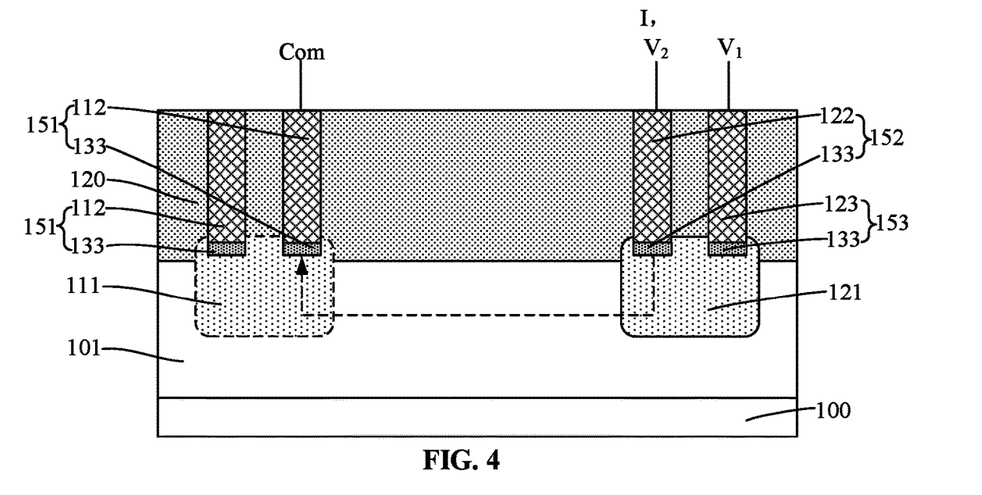

FIGS. 3-4 illustrate an exemplary testing structure consistent with various disclosed embodiments. FIG. 3 is a top view of a portion of a testing structure, where a well region and a dielectric layer are not illustrated. FIG. 4 is a cross-sectional view of the structure illustrated in FIG. 3 along the AA1 direction.

As shown in FIGS. 3-4, the testing structure may include a base substrate (not labeled) and a well region 101 in the base substrate. The testing structure may also include a plurality of discrete first doped epitaxial regions 121 in the well region 101. The doping type of the first doped epitaxial regions 121 may be the same as the doping type of the well region 101.

Further, the testing structure may include a dielectric layer 120 on the base substrate. The dielectric layer 120 may cover the well region 101 and the first doped epitaxial regions 121. Further, the testing structure may also include first conductive plugs 151 passing through the dielectric layer 120 and electrically connected with the well region 101; and a second contact plug 152 and a third contact plug 153 passing through the dielectric layer 120 and electrically connected with the first doped epitaxial regions 121. The second contact plug 152 and the third contact plug 153 may be independent from each other; and the second contact plug 152 may be between the first contact plug 151 and the third contact plug 153.

A first testing pad 11 may be formed on a portion of the surface of the first contact plug 151. A second testing pad 12 and a third testing pad 13 may be formed on portions of the surface of the second contact plug 152. A fourth testing 14 may be formed on a portion of the surface of the third contact plug 153.

The second contact plug 152 may include a metal silicide layer 133 on the first doped epitaxial region 121 and a first conductive plug 122 on the metal silicide layer 133. The second contact plug 152 may have two end portions (not labeled) along the direction parallel to the base substrate and the length direction of the second contact plug 152. The second testing pad 12 may be formed on one end portion, e.g., a first end portion, of the second contact plug 152; and the third testing pad 13 may be formed on the other end portion, e.g., a second end portions, of the second contact plug 152. Thus, the length direction of the second contact plug 152 refers to as the direction between the second testing pad 12 and the third testing pad 13.

In one embodiment, the base substrate includes a semiconductor substrate 100 and a plurality of discrete fins 110 on the semiconductor substrate 100. The well region 101 may be in the fins 110. Correspondingly, the first doped epitaxial regions 121 may be formed in the fins 110.

In one embodiment, the semiconductor substrate 100 is a silicon substrate. In some embodiments, the semiconductor substrate may also be made of germanium, silicon germanium, silicon carbide, gallium arsenide, or gallium indium, etc. The semiconductor substrate may also be a silicon on insulator (SOI) substrate, or a germanium on insulator (GOI) substrate.

The fins 110 and the semiconductor substrate 100 may be made of a same material, or different materials. In one embodiment, the fins 110 are made of silicon. In some embodiments, the fins may be made of germanium, silicon germanium, silicon carbide, gallium arsenide, or gallium indium, etc.

In some embodiments, the base substrate may be a planar substrate.

To allow the testing structure to be more similar to the practical device having the embedded stress technology, the testing structure also include a second doped epitaxial region 111 in the well region 101 under the first contact plug 151. The first contact plug 151 and the second doped epitaxial region 111 may be electrically connected together. The second doped epitaxial region 111 and the first doped epitaxial region 121 may be independent from each other. Further, to ensure a close-loop electrical circuit to be formed in the testing structure, the second doped epitaxial region 111 and the first doped epitaxial region 121 may be made of a same material. Thus, the accuracy and the reliability of the measured contact resistance may be increased.

In one embodiment, the testing structure may be used to measure the contact resistance of an NMOS device, correspondingly, the doping type of the first doped epitaxial region 121 and the second doped epitaxial region 111 may be N-type. The material of the first doped epitaxial region 121 and the second doped epitaxial region 111 may be N-type doped Si, or N-type doped SiC. The doping type of the well region 101 may be N-type. The N-type doping ions may be one or more of P ions, As ions and Sb ions, etc.

In some embodiments, the first doped epitaxial region and the second doped epitaxial region may be P-type doped. The material of the first doped epitaxial region and the second doped epitaxial region may be P-type doped Si, or P-type doped SiGe. The doping type of the well region may be P-type. The P-type doping ions may be one or more of B ions, Ga ions and In ions.

In one embodiment, the top surface of the first doped epitaxial region 121 may be above the surface of the base substrate; and the top surface of the second doped epitaxial region 111 may be above the surface of the base substrate. That is, the top surface of the first doped epitaxial region 121 and the top surface of the second doped epitaxial region 111 may be above the top surfaces of the fins 110. In some embodiments, the top surface of the first doped epitaxial region may level the top surface of the base substrate; and the top surface of the second doped epitaxial region may level with the top surface of the base substrate.

Further, the cross-section of the first doped epitaxial region 121 may be square-shaped, U-shaped, or sigma-shaped, etc. The cross-section of the second doped epitaxial region 111 may be square-shaped, U-shaped, or sigma-shaped, etc.

The dielectric layer 120 may be made of an insulation material. The dielectric layer 120 may be used to electrically isolate the adjacent fins 110 and the conductive plugs. In one embodiment, the dielectric layer 120 is made of silicon oxide. In some embodiments, the dielectric layer may be made of silicon nitride, or silicon oxynitride, etc.

Referring to FIGS. 3-4, one end portion (the first end portion) of the second contact plug 152 may be used as a terminal for applying a first external current "I". The other end portion (the second end portion) of the second contact plug 152 may be used as a terminal for measuring the top potential "$V_2$". The second contact plug 152 may include the metal silicide layer 133 on the first doped epitaxial region 121 and a first conducive plug 122 on the metal silicide layer 133.

The metal silicide layer 133 may be used to reduce the contact resistance between the first doped epitaxial region 121 and the first contact plug 122. In one embodiment, the metal silicide layer 122 may be formed on a portion of the first doped epitaxial region 121. In some embodiments, the metal silicide layer may be on the entire surface of the first doped epitaxial region.

The first metal silicide layer 133 may be made of silicon nickel, or silicon titanium, etc. The first conductive plug 122 may be made of Cu, Al, or W, etc.

In one embodiment, the number of the first doped epitaxial region 121 is one. Thus, the second contact plug 152 and the third contact plug 153 may be connected to a same first doped epitaxial region 121. That is, the second contact plug 152 and the third contact plug 153 may be formed on the same first doped epitaxial region 121.

In one embodiment, to allow the testing structure to be more similar to the practical device using the embedded stress technology, the third contact plug 153 may include the metal silicide layer 133 on the first doped epitaxial region 121 and a second conductive plug 123 on the metal silicide layer 133. The metal silicide layer 133 under the first conductive plug 122 and the metal silicide layer 133 under the second conductive plug 123 may be independent from each other. In some embodiments, the third contact plug may only include a second conductive plug.

In some other embodiments, when the third contact plug includes the metal silicide layer on the first doped epitaxial region and the second conductive plug on the metal silicide layer, the metal silicide layer may be formed on a portion of the first doped epitaxial region; and the first conductive plug and the second conductive plug may be electrically connected to a same metal silicide layer.

In some embodiments, the number of the first doped epitaxial regions may be two. The two first doped epitaxial regions may be at a same side of the second doped epitaxial region. The second contact plug may be electrically connected to the first doped epitaxial region at the side adjacent to the first contact plug. The third contact plug may be electrically connected with the other first doped epitaxial region.

To increase the testing accuracy of the testing structure, the second conductive plug 123 and the first conductive plug 122 may be made of a same material. The second conductive plug 123 may be made of Cu, Al, or W, etc.

The first contact plug 151 may be used as a terminal for applying a second external current "Com"; and the value of the second external current "Com" may be smaller than the value of the first external current "I". Thus, with the function of the first external current "I" and the second external current "Com", a current loop may be formed among the second contact plug 152, the first doped epitaxial region 121, the well region 101 and the first contact plug 151.

In one embodiment, the number of the first contact plugs 151 is two. In some embodiments, the number of the first contact plug may be one, or more than two.

In one embodiment, to allow the testing structure to be more similar to the practical device using the embedded stress technology, the first contact plug 151 may include the metal silicide layer 133 on the second doped epitaxial region 111 and the third conductive plug 112 on the metal silicide layer 133. In some embodiments, the first contact plug may only include a third conductive plug.

To increase the testing accuracy of the testing structure, the third conductive plug 112, the second conductive plug 123 and the first conductive plug 122 may be made of a same material. The third conductive plug 112 may be made of Cu, Al, or W, etc.

When the first external current "I" is applied to the first end portion of the second contact plug 152 and the second external current "Com" is applied to the first contact plug 151, a current loop may be formed among the second contact plug 152, the first doped epitaxial region 121, the well region 101 and the first contact plug 151 (referring to the dashed line arrow). The top potential "$V_2$" of the second contact plug 152 may be measured from the second end portion of the second contact plug 152. The top potential "$V_2$" refers to as the top potential of the second contact plug 152 along the direction perpendicular to the surface of the semiconductor substrate 100.

The third contact plug 153 may not be in the current loop; and the doping type of the well region 101 and the doping type of the first doped epitaxial region 121 may be same; and the third contact plug 153 may be electrically connected to the first doped epitaxial region 121. Thus, the potential "$V_1$" measured from the third contact plug 153 may be used as the bottom potential "$V_1$" of the first doped epitaxial region 121. The bottom potential "$V_1$" refers to as the bottom potential "$V_1$" along the direction perpendicular to the surface of the semiconductor substrate 100.

The terminal voltage between the first doped epitaxial region 121 and the first contact plug 151 may be the potential difference "$V_2-V_1$" between the top potential "$V_2$" and the bottom potential "$V_1$". At the same time, the resistance "$R_1$" of the first conductive plug 122, the resistance "$R_2$" of the metal silicide layer 133 under the first conductive plug 122 and the resistance "$R_3$" of the first doped epitaxial region 121 may be obtainable. According to these parameters, the contact resistance "$R_C$" between the metal silicide layer 133 and the first doped epitaxial region 121 may be obtained.

In one embodiment, as shown in FIG. 3, the testing structure may also include the first testing pad 11 formed on a portion of a surface of the first contact plug 151 and electrically connected with the first contact plug 151; the second testing pad 12 formed on the surface of the end portion of the second contact plug 152 and the electrically connected with the second contact plug 152; the third testing pad 13 formed on the surface of the second end portion of the second contact plug 152 and electrically connected with the second contact plug 152; and the fourth testing pad 14 formed on a portions of the surface of the third contact plug 153 and electrically connected with the third contact plug 153. The second external current "Com" may be applied to the first contact plug 151 through the first testing pad 11. The first external current "I" may be applied to the second contact plug 152 through the second testing pad 12. The top potential "$V_2$" of the second contact plug 152 may be obtained through the third testing pad 13. The bottom potential "$V_1$" of the first doped epitaxial region 121 may be obtained through the fourth testing pad 14.

In one embodiment, to improve the quality of the first conducive plug 122, the testing structure may also include a barrier layer (not shown) between the first conductive plug 122 and the dielectric layer 120 and between the first conductive plug 122 and the metal silicide layer 133. The barrier layer may be made of any appropriate material. In one embodiment, the barrier layer is made of TiN. The barrier layer may also be between the second conducive plug 123 and the metal silicide layer 133. The barrier layer may also be between the third conductive plug 112 and the dielectric layer 120 and between the third conductive plug 112 and the metal silicide layer 133.

Figure 8:
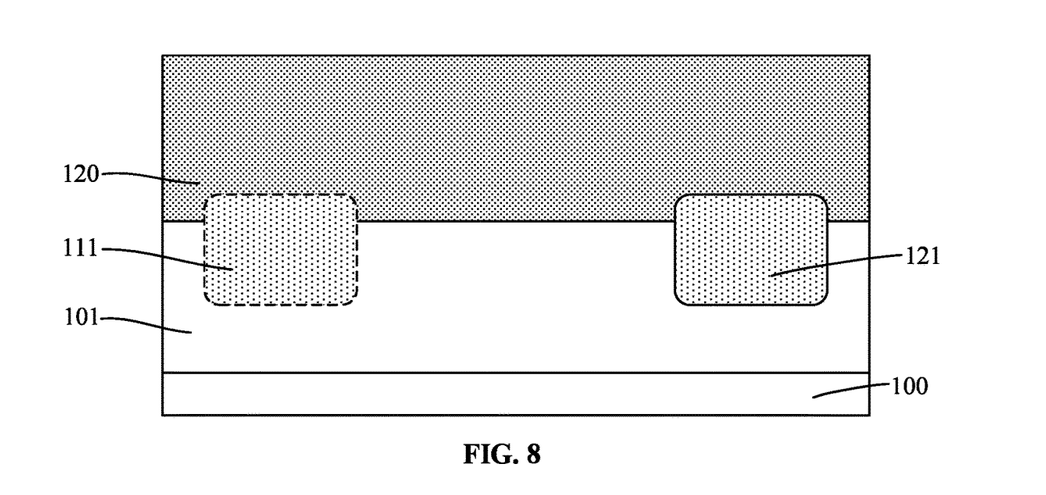
Figure 9:
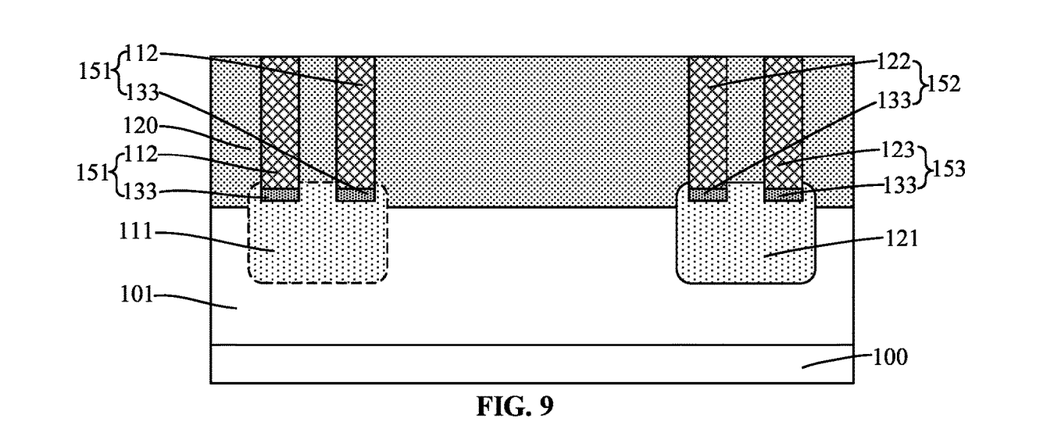
Figure 10:
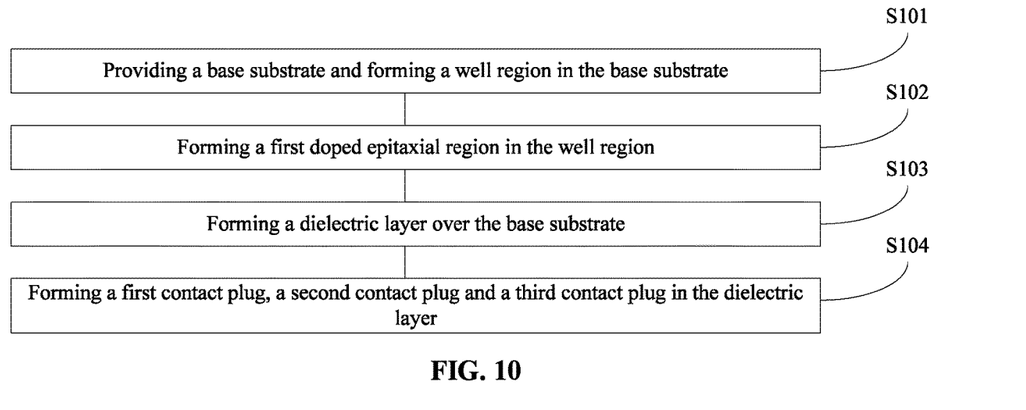
FIG. 10 illustrates an exemplary fabrication process of a testing structure consistent with various disclosed embodiments.

FIG. 10 illustrates an exemplary fabrication process of a testing structure consistent with various disclosed embodiments. FIGS. 5-9 illustrate structures corresponding to certain stages during the exemplary fabrication process.

Figure 5:
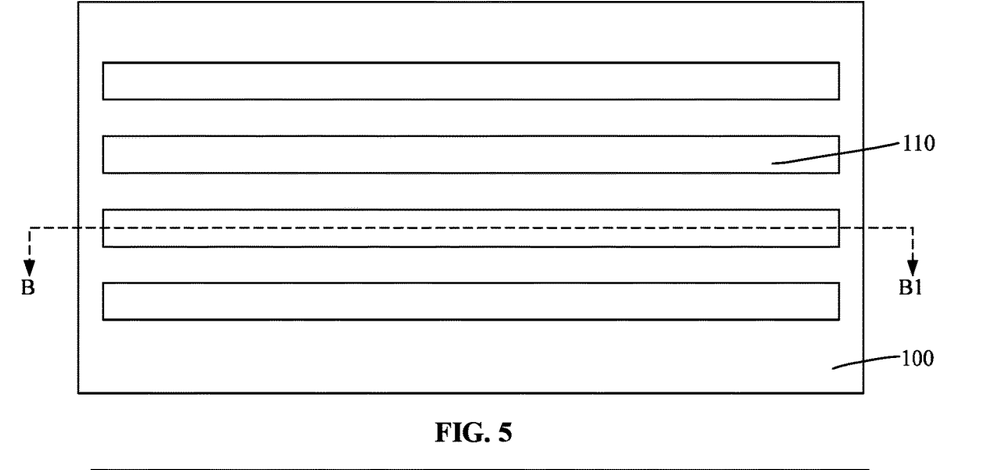
FIGS. 5-9 illustrate structures corresponding to certain stages of an exemplary fabrication process of a testing structure consistent with various disclosed embodiments.
Figure 6:
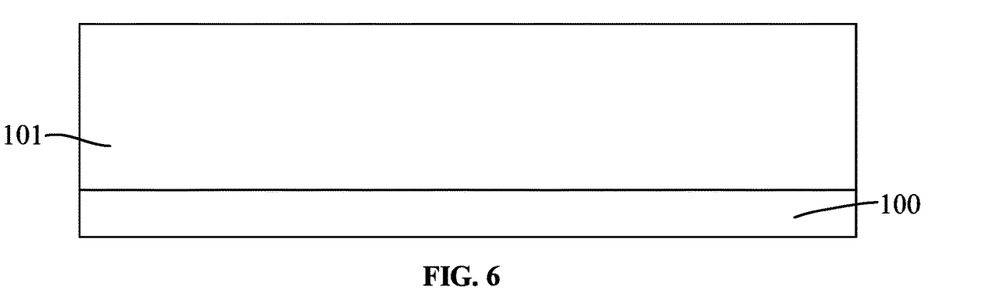

As shown in FIG. 10, at the beginning of the fabrication process, a base substrate with certain structures is provided (S101). FIGS. 5-6 illustrate a corresponding semiconductor structure. FIG. 5 is a top view of the semiconductor structure; and FIG. 6 is a cross-sectional view of the structure illustrated in FIG. 5 along the BB1 direction.

As shown in FIGS. 5-6, a base substrate is provided. In one embodiment, the testing structure is used to measure the contact resistances of a fin field-effect transistor (FinFET) device, the base substrate may include a semiconductor substrate 100 and a plurality of discrete fins 110 on the semiconductor substrate 100.

In one embodiment, the semiconductor substrate 100 is a silicon substrate. In some embodiments, the semiconductor substrate may also be made of germanium, silicon germanium, silicon carbide, gallium arsenide, or gallium indium, etc. The semiconductor substrate may also be a silicon on insulator (SOI) substrate, or a germanium on insulator (GOI) substrate.

The fins 110 and the semiconductor substrate 100 may be made of a same material, or different materials. In one embodiment, the fins 110 are made of silicon. In some embodiments, the fins may be made of germanium, silicon germanium, silicon carbide, gallium arsenide, or gallium indium, etc.

In some embodiments, the base substrate may be a planar substrate.

Further, as shown in FIG. 6, a well region 101 may be formed in the fins 110.

To allow a current loop to be formed in the testing structure and increase the accuracy and reliability of the measured contact resistance, the doping type of the well region 101 and the doping type of the subsequently formed doped epitaxial regions may be same.

In one embodiment, the testing structure may be used to measure the contact resistances of an NMOS device. That is, the subsequently formed doped epitaxial regions may be N-type doped. Correspondingly, the doping type of the well region 101 may be N-type. The N-type doping ions may be one or more of P ions, As ions and Sb ions, etc.

In some embodiments, when the testing structure is used to measure the contact resistances of a PMOS device, the well region is P-type doped. The P-type doping ions may be one or more of B ions, Ga ions and In ions.

Figure 7:
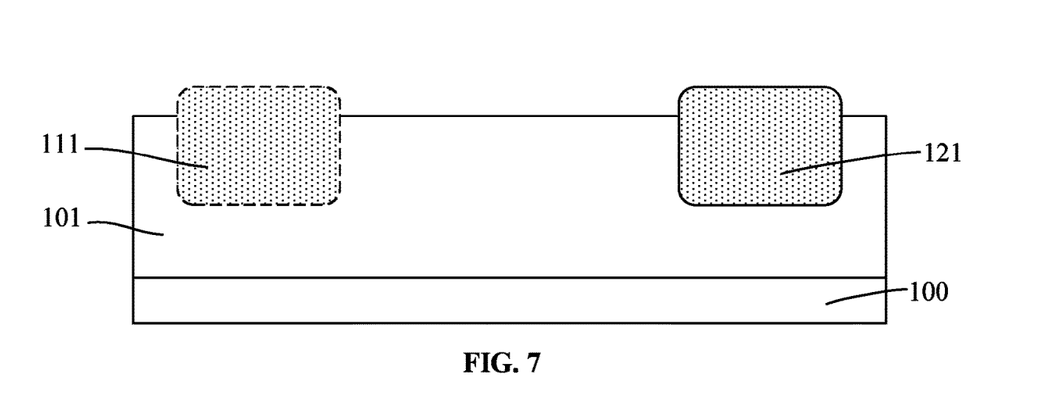

Returning to FIG. 10, after providing the base substrate and forming the well region, a first doped epitaxial region may be formed (S102). FIG. 7 illustrates a corresponding semiconductor structure.

As shown in FIG. 7, a first doped epitaxial region 121 may be formed in the well region 101. The doping type of the first doped epitaxial region 121 may be the same as the doping type of the well region 101.

Because the well region 101 may be in the fins 110, correspondingly, the first doped epitaxial region 121 may also be in the fins 110. The first doped epitaxial region 121 may provide a process base for subsequently forming a second contact plug and a third contact plug.

In one embodiment, to allow the testing structure to be more similar to a practical device using the embedded stress technology, during the process for forming the first doped epitaxial region 121, a second doped epitaxial region 111 may also be formed in the well region 101 at one side of the first doped epitaxial region 121. The second doped epitaxial region 111 may be independent from the first doped epitaxial region 121. Further, to form a current loop inside the testing structure during a testing process, the second doped epitaxial region 111 and the first doped epitaxial region 121 may be made of a same material. Accordingly, the accuracy and the reliability of the measured contact resistance may be increased. In some embodiments, the second doped epitaxial region may be omitted.

The position of the second doped epitaxial region 111 may correspond to the position of the subsequently formed first contact plug. The second doped epitaxial region 111 may provide a process base for subsequently forming the first contact plug.

The process for forming the second doped epitaxial region 111 and the first doped epitaxial region 121 may include etching a partial thickness of the well region 101 to form a first trench (not shown) corresponding to the first doped epitaxial region 121 in the well region 101 and a second trench (not shown) corresponding to the second doped epitaxial region 111 in the well region 101; forming a first doped epitaxial layer (not shown) to fill the first trench and a second doped epitaxial layer (not shown) to fill the second trench by a selective epitaxial growth process; and forming the first doped epitaxial region 121 and the second doped epitaxial region 111 by a doping process. The doping process may be performed during the selective epitaxial growth process, or after the selective epitaxial growth process.

In one embodiment, the testing structure is used to measure the contact resistances of an NMOS device. Thus, the type of the doping ions may be N-type during the doping process on the first doped epitaxial layer and the second doped epitaxial layer.

The first doped epitaxial layer may be made of Si, or SiC, etc. Thus, the first doped epitaxial region 121 and the second doped epitaxial region 111 may be made of N-type doped Si, or SiC, etc. The N-type ions may be one or more of P ions, As ions and Sb ions In some embodiments, the testing structure is used to measure the contact resistances of a PMOS device. Thus, the type of the doping ions may be P-type during the doping process on the first doped epitaxial layer and the second doped epitaxial layer. The first doped epitaxial layer may be made of Si, or SiGe, etc. The second doped epitaxial layer may be made of Si, or SiGe, etc. Thus, the first doped epitaxial region 121 and the second doped epitaxial region 111 may be made of P-type doped Si, or SiGe, etc. The P-type ions may be one or more of B ions, Ga ions and In ions.

In one embodiment, the top surface of the first doped epitaxial region 121 may be above the surface of the base substrate; and the top surface of the second doped epitaxial region 111 may be above the surface of the base substrate. That is, the top surface of the first doped epitaxial region 121 and the top surface of the second doped epitaxial region 111 may be above the top surfaces of the fins 110. In some embodiments, the top surface of the first doped epitaxial region may level the surface of the base substrate; and the top surface of the second doped epitaxial region may level with the surface of the base substrate.

Further, the cross-section of the first doped epitaxial region 121 may be square-shaped, U-shaped, or sigma-shaped. The cross-section of the second doped epitaxial region 111 may be square-shaped, U-shaped, or sigma-shaped.

In one embodiment, the number of the first doped epitaxial region 121 is one. Correspondingly, a second contact plug and a third contact plug may be subsequently formed on a same first doped epitaxial region 121.

In some embodiments, the number of the first doped epitaxial regions may be two; and the two first doped epitaxial regions may be adjacent to each other. That is, the two first doped epitaxial regions may be at a same side of the second doped epitaxial region. Correspondingly, during the subsequent process for forming the second contact plug and the third contact plug, the second contact plug may be formed on one of the two first doped epitaxial regions; and the third contact plug may be formed on the other first doped epitaxial region. In other embodiments, the number of the first doped epitaxial regions may be greater than two.

Returning to FIG. 10, after forming the first doped epitaxial region, a dielectric layer may be formed (S103). FIG. 8 illustrates a corresponding semiconductor structure.

As shown in FIG. 8, a dielectric layer 120 is formed over the base substrate. The dielectric layer 120 may cover the well region 101 and the first doped epitaxial region 121.

The dielectric layer 120 may provide a process base for subsequently forming a first contact plug, a second contact plug and a third contact plug. Further, the dielectric layer 120 may also be used to electrically isolate adjacent fins 110 and the subsequently formed first contact plug, second contact plug and third contact plug.

The dielectric layer 120 may be made of an insulation material. In one embodiment, the dielectric layer 120 is made of silicon oxide. In some embodiments, the dielectric layer may also be made of silicon nitride, or silicon oxynitride, etc.

In one embodiment, the second doped epitaxial region 111 may be formed in the well region 101. Thus, the dielectric layer 120 may also cover the second doped epitaxial region 111.

In some embodiments, for example, when a silicide-first process is used to form the testing structure, before forming the dielectric layer, a metal silicide layer may be formed on the first doped epitaxial region. The metal silicide layer may be formed on a partial, or entire surface of the first doped epitaxial region.

Returning to FIG. 10, after forming the dielectric layer, first contact plugs, a second contact plug, and a third contact plug may be formed (S104). FIG. 9 illustrates a corresponding semiconductor structure.

As shown in FIG. 9, first contact plugs 151 are formed in the dielectric layer 120 at one side of the first doped epitaxial region 121. The first contact plugs 151 may pass through the dielectric layer 120, and may be electrically connected with the well region 101. Further, a second contact plug 152 and a third contact plug 153 may be formed in the dielectric layer 120. The second contact plug 152 and the third contact plug 153 may pass through the dielectric layer 120 and may be electrically connected with the first doped epitaxial region 121. The second contact plug 152 and the third contact plug 153 may be independent from each other; and the second contact plug 152 may be between the first contact plug 151 and the third contact plug 153. The second contact plug 152 may include a metal silicide layer 133 on the first doped epitaxial region 121 and the first conductive plug 122 on the metal silicide layer 133. The surface of the second contact plug 152 may have two end portions, a first end portion and a second end portion, along the direction parallel to the base substrate and the length direction of the second contact plug 152.

The second doped epitaxial region 111 may be formed in the well region 101 at the one side of the first doped epitaxial region 121. Thus, during the process for forming the first contact plug 151, the first contact plug 151 may be formed in the dielectric layer 120. The first contact plug 151 may pass through the dielectric layer 120 and may be electrically connected with the second doped epitaxial region 111.

In one embodiment, the number of the first contact plugs 151 is two. In some embodiments, the number of the first contact plug may be one, or greater than two.

To allow the testing structure to be more similar to the practical device using the embedded stress process and to reduce the process difficulties and steps, in one embodiment, during the process for forming the first contact plug 151, the first contact plug 151 may include the metal silicide layer 133 on the second doped epitaxial region 111 and a third conductive plug 112. During the process for forming the third contact plug 153, the third contact plug 153 may include the metal silicide layer 133 on the first doped epitaxial region 121 and the second conductive plug 123 on the metal silicide layer 133. Thus, the first contact plug 151, the second contact plug 152 and the third contact plug 153 may be formed in a same step.

In one embodiment, a silicide-last process may be used to form the metal silicide layer 133. Thus, after subsequently etching the dielectric layer 120 to expose the first doped epitaxial region 121, the metal silicide layer 133 may be formed on the first doped epitaxial region 121.

The process for forming the first contact plug 151, the second contact plug 152 and the third contact plug 153 may include etching the dielectric layer 120 to form a first through hole (not labeled) and a second through hole exposing the first doped epitaxial region 121 and passing through the dielectric layer 120, and a third through hole (not labeled) exposing the second doped epitaxial region 111 and passing through the dielectric layer 120; forming a metal silicide layer 133 on the portions of the first doped epitaxial region 121 exposed by the first through hole and the second through hole and the portion of the second doped epitaxial region 111 exposed by the third through hole; and forming the first conductive plug 122 on the metal silicide layer 133 by filling the first through hole, the second conductive plug 123 on the metal silicide layer 133 by filling the second through hole and the third conductive plug 112 on the metal silicide layer 133 by filling the third through hole.

In some embodiments, the first contact plug may only include a third conductive plug; and the third contact plug may only include a second conductive plug.

In one embodiment, the number of the first doped epitaxial region 121 is one. Thus, during the process for forming the second plug 152 and the third contact plug 153, the second contact plug 152 and the third contact plug 153 may be formed on the same first doped epitaxial region 121. That is, the second contact plug 152 and the third contact plug 153 may be electrically connected with the same first epitaxial region 121. Further, because the second contact plug 152 and the third contact plug 153 may be independent from each other, the first through hole may expose a portion of the surface of the first doped epitaxial region 121; and the second through hole may expose a portion of the first doped epitaxial region 121. Correspondingly, the metal silicide layer 133 may be formed on portions of the surface of the first doped epitaxial region 121.

In one embodiment, the number of the first contact plugs 151 is two. Similarly, the metal silicide layer 133 under the first contact plugs 151 may be on portions of the surface of the first epitaxial region 121.

In some embodiments, when the number of the first doped epitaxial regions is two, during the process for forming the second contact plug and the third contact plug, the second contact plug may be electrically connected to the first doped epitaxial region adjacent to the first contact plug; and the third contact plug may be electrically connected to the other first doped epitaxial region. Thus, the first through hole may expose a portion of, or the entire surface of the first doped epitaxial region at the side adjacent to the first contact plug; and the second through hole may expose a portion of, or the entire surface of the other first doped epitaxial region. Correspondingly, the metal silicide layer may be on portions of, or the entire surface of the first doped epitaxial regions.

To improve the quality of the first conductive plug 122, after forming the first through hole and before forming the first conductive plug 122, a barrier layer (not shown) may be formed on the bottom and side surfaces of the first through hole. In one embodiment, the barrier layer is made of TiN. The barrier layer may also be formed on the bottom and side surfaces of the second through hole; and on the bottom and side surfaces of third through hole.

FIG. 3 illustrates a top view of an exemplary testing structure consistent with various disclosed embodiments (the well region and the dielectric layer are not showed). As shown in FIG. 3, the fabrication process of the testing structure may also include forming a first testing pad 11 electrically connected with the first contact plug 151 on a portion of the surface of the first contact plug 151; forming a second testing pad 12 electrically connected with the first end portion of the second contact plug 152 on the surface of the first end portion of the second contact plug 152; forming a third testing pad 13 electrically connected with the second end portion of the second contact plug 152 on the surface of the second end portion of the second contact plug 152; and forming a fourth testing pad 14 electrically connected with the third contact plug 153 on a portion of the surface of the third contact plug 153.

A second external current "Com" may be applied to the first contact plug 151 through the first testing pad 11. A first external current "I" may be applied to the second contact plug 152 through the second testing pad 12. A top potential "$V_2$" of the second contact plug 152 may be obtained through the third testing pad 13. A bottom potential "$V_1$" of the first doped epitaxial region 121 may be obtained through the fourth testing pad 14.

Figure 11:
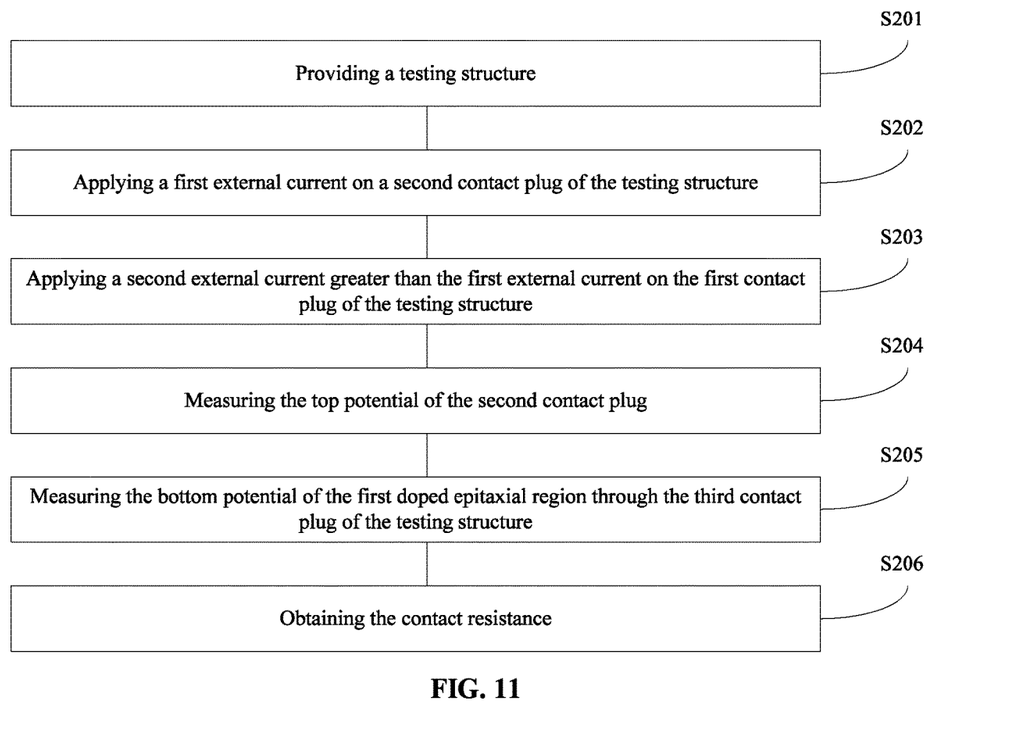
FIG. 11 illustrates an exemplary testing method consistent with various disclosed embodiments.

The present disclosure also provides a testing method. FIG. 11 illustrates an exemplary testing method consistent with various disclosed embodiments.

As shown in FIG. 11, the testing method may include providing a disclosed testing structure, or other appropriate testing structures (S201); applying a first external current on the first end portion of the second contact plug (S202); applying a second external current greater than the first external current on the first contact plug to form a current loop among the second contact plug, the first doped epitaxial region under the second contact plug, the well region and the first contact plug (S203); measuring the top potential of the second contact plug through the second end portion of the second contact plug (S204); measuring the bottom potential of the first doped epitaxial region through the third contact plug (S205); and obtaining the contact resistance between the metal silicide layer and the first doped epitaxial region according to the first external current, the top potential and the bottom potential (S206).

The details of the testing method are described as followings using the accompanying drawings.

Referring to FIG. 4, a first external current "I" may be applied on the first end portion of the second contact plug 152; and a second external current "Com" may be applied on the first contact plug 151. The value of the second external current "Com" may be smaller than the value of the first external current "I". Thus, a current loop (illustrated as the dashed arrow in FIG. 4) may be formed among the second contact plug 152, the first doped epitaxial region 121 under the second contact plug 152, the well region 101 and the first contact plug 151.

By setting the value of the second external current "Com" to be smaller than the value of the first external current "I" so as to form the current loop, the current may flow through the first conductive plug 122, the metal silicide layer 133 under the first conductive plug 122 and the first doped epitaxial region 121.

In one embodiment, the second external current "Com" may be zero. In some embodiments, the second external current may also be a negative current. The first external current and the second external current may be set with any appropriate combination as long as a current loop may be formed among the second contact plug, the first doped epitaxial region under the second contact plug and the first contact plug.

Further, referring to FIG. 4, the top potential "$V_2$" of the second contact plug 152 may be measured through the second end portion of the second contact plug 152. The bottom potential "$V_1$" may be measured from the third contact plug 153. The top potential "$V_2$" refers to as the top potential of the second contact plug 152 along the direction perpendicular to the semiconductor substrate 100.

Because the third contact plug 153 may not be in the current loop, the potential "$V_1$" measured from the third contact plug 153 may be used as the bottom potential "$V_1$" of the first doped epitaxial region 121. The bottom potential "$V_1$" refers to as the potential on the bottom of the first doped epitaxial region 121 along the direction perpendicular to the surface of the semiconductor substrate 100.

According to the first external current "I", the top potential "$V_2$" and the bottom potential "$V_1$", the contact resistance "$R_c$" between the metal silicide layer 133 and the first epitaxial region 121 may be obtained.

Specifically, the process for obtaining the contact resistance "$R_c$" may include obtaining the total resistance "R" by dividing the difference between the top potential "$V_2$" and the bottom potential "$V_1$" with the first external current "I"; and obtaining the resistance of the first conductive plug 122, the resistance of the metal silicide layer 133 under the first conductive plug 122 and the resistance of the first doped epitaxial region 121. The difference between the total resistance "R" and the resistance of the first conductive plug 122, the resistance of the metal silicide layer 133 under the first conductive plug 122 and the resistance of the first doped epitaxial region 121 may be the contact resistance "$R_c$".

Specifically, the resistance of the first conductive plug 122 is denoted as "$R_1$", the resistance of the metal silicide layer 133 under the first conductive plug 122 is denoted as "$R_2$", and the resistance of the first doped epitaxial region 121 is denoted as "$R_3$". $R_1$, $R_2$ and $R_3$ may all be obtainable; and $R_1+R_2+R_3=(V_2-V_1)/I$.

In some embodiments, the testing structure may also include a barrier layer between the first conductive plug 122 and the dielectric layer 120 and between the first conductive plug 122 and the metal silicide layer 133. Correspondingly, the total resistance "R" may also include the resistance of the barrier layer. However, the resistance of the barrier layer may be substantially small; and it may be omitted.

Specifically, the value of the resistance "$R_1$" of the first conductive plug 122 may be obtained according to the material and the volume of the first conductive plug 122. The value of the resistance "$R_2$" of the metal silicide layer 133 under the first conductive plug 122 may be obtained according to the material and the volume of the metal silicon layer 133 under the first conductive plug 122. The value of the resistance "$R_3$" of the first doped epitaxial region 121 may be obtained according to the material and the volume of the first doped epitaxial region 121.

Thus, according to the obtained parameters, the contact resistance "$R_C$" between the metal silicide layer 133 and the first doped epitaxial region 121 may be obtained.

In the disclosed testing structure, when the first external current "I" and the second external current "Com" are applied, a current loop may be formed among the second contact plug 152, the first doped epitaxial region 121 under the second contact plug 152, the well region 101 and the first contact plug 151. Thus, the top potential "$V_2$" may be measured from the second end portion of the second contact plug 152. The third contact plug 153 may not be in the current loop. Thus, the potential "$V_1$" measured through the third contact plug 153 may be the bottom potential "$V_1$" of the first doped epitaxial region 121. Therefore, the contact resistance "$R_C$" between the metal silicide layer 133 and the first doped epitaxial region 121 may be obtained according to the first external current "I", the top potential "$V_2$" and the bottom potential "$V_1$". Comparing with the conventional approach that utilizes the transmission line modeling (TLM) to obtain the contact resistance, the disclosed method may be able to avoid the error issue caused by the size differences among different contact plugs. Thus, the contact resistance obtained by the disclosed method may have relatively high accuracy and reliability.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A testing method, comprising:
   providing a testing structure having a base substrate containing a well region, a first doped epitaxial region in the well region and having a doping type same as a doping type of the well region, a dielectric layer on the base substrate and covering the well region and the first doped epitaxial region, a first contact plug passing through the dielectric layer and electrically connected with the first well region; and a second contact plug and a third contact plug, each passing through the dielectric layer and electrically connected with the first doped epitaxial region, wherein the second contact plug is independent from the third contact plug and between the first contact plug and the third contact plug;
   applying a first external current on a first end portion of the second contact plug;
   applying a second external current smaller than the first external current on the first contact plug to form a current loop among the first contact plug, the first doped epitaxial region under the second contact plug and the first contact plug;
   measuring a top potential of the second contact plug through a second end portion of the second contact plug;
   measuring a bottom potential of the first doped epitaxial region through the third contact plug; and
   obtaining a contact resistance between a metal silicide layer and the first doped epitaxial region according to the first external current, the top potential and the bottom potential.

2. The testing method according to claim 1, wherein:
   the second external current is equal to, or smaller than zero.

3. The testing method according to claim 1, wherein obtaining the contact resistance comprises:
   obtaining a total resistance by dividing a potential difference between the top potential and the bottom potential with the first external current; and
   obtaining a resistance of a first conductive plug of the second contact plug, a resistance of the metal silicide layer of the second contact plug and a resistance of the first doped epitaxial region,
   wherein a difference between the total resistance and the resistance of the first conductive plug, the resistance of the metal silicide layer and the resistance of the first doped epitaxial region is the contact resistance.

* * * * *